(12) United States Patent
Jacobson et al.

(10) Patent No.: US 6,241,921 B1
(45) Date of Patent: Jun. 5, 2001

(54) HETEROGENEOUS DISPLAY ELEMENTS AND METHODS FOR THEIR FABRICATION

(75) Inventors: Joseph M. Jacobson, Newton; Hidekazu Yoshizawa, Brookline, both of MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 09/206,310

(22) Filed: Dec. 7, 1998

Related U.S. Application Data
(60) Provisional application No. 60/085,578, filed on May 15, 1998.

(51) Int. Cl.$^7$ ............................................. B29D 11/00
(52) U.S. Cl. ..................... 264/1.36; 264/1.7; 264/437; 264/438; 264/4.1
(58) Field of Search ..................... 264/1.1, 1.36, 264/1.38, 1.7, 108, 343, 436, 437, 439, 440, 4, 4.1, 438, 484, 491

(56) References Cited

U.S. PATENT DOCUMENTS

| | | | |
|---|---|---|---|
| 2,800,457 | 7/1957 | Green et al. | 252/316 |
| 3,406,363 | 10/1968 | Tate | 335/302 |

(List continued on next page.)

FOREIGN PATENT DOCUMENTS

| | | |
|---|---|---|
| 19529264A1 | 2/1996 | (DE) . |
| 0 622 721 A1 | 11/1994 | (EP) . |
| 2292119A | 2/1996 | (EP) . |
| 2324273A | 10/1998 | (EP) . |
| 2077148A | 12/1981 | (GB) . |
| 01177517 | 7/1989 | (JP) . |
| WO94/28202 | 12/1994 | (WO) . |
| WO 97/04398 | 2/1997 | (WO) . |
| WO 98/03896 | 1/1998 | (WO) . |

OTHER PUBLICATIONS

Jin, S., et al., "Optically Transparent, Electrically Conductive Composite Medium," Science, pp. 446–448 (Jan. 1992).
Yang, Y., et al., "A New Architecture for Polymer Transistors," Nature, vol. 373 (Nov. 1994).
Egashira, N., et al., "A Solid Electrochromic Cell Consisting of Lu–Diphthalocyanine and Lead Fluoride," Proceedings of the S.I.D., vol. 28/3, pp. 227–232 (1987).
Chen et al., "Interfacial Phenomena Controlling Particle Morphology of Composite Lataxes," *J. App. Pol. Sci.*, vol. 42, pp. 1049–1063 (1991).

(List continued on next page.)

Primary Examiner—Mathieu D. Vargot
(74) Attorney, Agent, or Firm—Testa, Hurwitz & Thibeault LLP

(57) ABSTRACT

Optically heterogeneous display elements utilize fused pigment particles, which may be manufactured with polymer shells having desired charge, photoresponse, or density characteristics. The particles may be microencapsulated prior to formation of the display element, so that the element is formed internally within the container in which it is permanently housed. The element may function as a bichromal display, a light valve, or a programmable magnetic element.

11 Claims, 10 Drawing Sheets

U.S. PATENT DOCUMENTS

| | | | |
|---|---|---|---|
| 3,460,248 | 8/1969 | Tate | 29/607 |
| 3,585,381 | 6/1971 | Hedson et al. | 250/47 |
| 3,668,106 | 6/1972 | Ota | |
| 4,001,140 | 1/1977 | Foris et al. | 252/316 |
| 4,093,534 | 6/1978 | Carter et al. | 350/355 |
| 4,143,103 | 3/1979 | Sheridon | 264/4 |
| 4,227,775 | 10/1980 | Goodrich | 350/267 |
| 4,231,641 | 11/1980 | Randin | 350/357 |
| 4,261,653 | 4/1981 | Goodrich | 350/362 |
| 4,273,672 | 6/1981 | Vassiliades | 252/316 |
| 4,285,801 | 8/1981 | Chiang | 204/299 R |
| 4,298,448 | 11/1981 | Muller et al. | 204/299 R |
| 4,305,807 | 12/1981 | Somlyody | 204/299 R |
| 4,419,383 | 12/1983 | Lee | 427/47 |
| 4,438,160 | 3/1984 | Ishikawa et al. | 427/214 |
| 4,643,528 | 2/1987 | Bell, Jr. | 350/334 |
| 4,891,245 | 1/1990 | Micale | 427/213.3 |
| 4,919,521 | 4/1990 | Tada et al. | 350/362 |
| 4,931,019 | 6/1990 | Park | 434/409 |
| 4,947,219 | 8/1990 | Boehm | 357/20 |
| 5,057,363 | 10/1991 | Nakanishi | 428/321 |
| 5,066,559 | 11/1991 | Elmasry et al. | 430/111 |
| 5,082,351 | 1/1992 | Fergason | 359/51 |
| 5,105,185 | 4/1992 | Nakanowatari et al. | 340/784 |
| 5,270,843 | 12/1993 | Wang | 359/52 |
| 5,344,594 | 9/1994 | Sheridon | 264/4.1 |
| 5,380,362 | 1/1995 | Schubert | 106/493 |
| 5,389,945 | 2/1995 | Sheridon | 345/85 |
| 5,411,398 | 5/1995 | Nakanishi et al. | 434/409 |
| 5,508,068 | 4/1996 | Nakano | 428/1 |
| 5,604,027 | 2/1997 | Sheridon | 428/323 |
| 5,717,514 | 2/1998 | Sheridon | 359/296 |
| 6,067,185 * | 5/2000 | Albert et al. | 264/8 |

OTHER PUBLICATIONS

Lawrence L. Lee, "Fabrication of Magnetic Particles Display," *Proceedings of the S.I.D.,* vol. 18, Nos. 3&4, 1977, pp. 283–288.

J. Sankus "Electrophoretic Display Cell," *Xerox Disclosure Journal*, Abstract, vol. 4, Num. 3, May/Jun. 1979.

Nuno A. Vaz et al., "Dual frequency addressing of polymer-dispensed liquid–crystal films," *Journal of Applied Physics*, vol. 65, No. 12, Jun., 1989, pp. 5043–5049.

Hosaka, H., et al., "Electromagnetic Microrelays: Concepts and Fundamental Characteristics," Sensors and Actuators A, pp. 41–47 (1994).

Sheridon, N.K., et al., "The Gyricon—A Twisting Ball Display," Proceeding of the S.I.D., vol. 18/3 & 4, pp. 289–293 (1977).

Saitoh, M., et al., "A Newly Developed Electrical Twisting Ball Display," Proceedings of the S.I.D., vol. 23/4, pp. 249–253 (1982).

Bohnke, O., et al., "Polymer–Based Solid Electrochromic Cell for Matrix–Addressable Display Devices," J. Electrochem. Soc., 138(12):3612–3617 (Dec. 1991).

Clarisse, C., et al., "Field–Effect Transistor with Diphthalocyanine Thin Film," Electronics Letters, 24(11):674–675 (May 1988).

Bryce, M.R., "Seeing Through Synthetic Metals," Nature, vol. 335 (Sep. 1988).

* cited by examiner

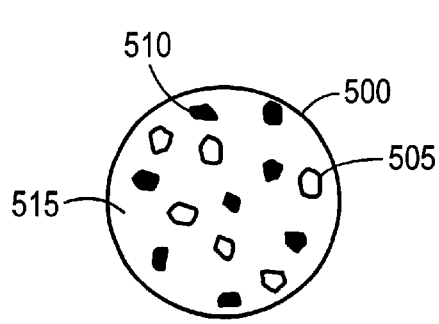
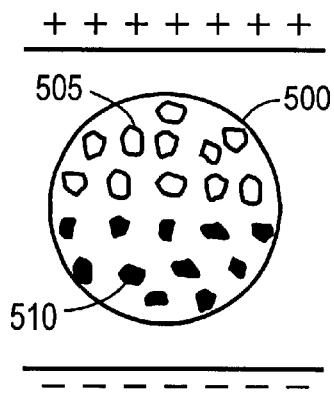
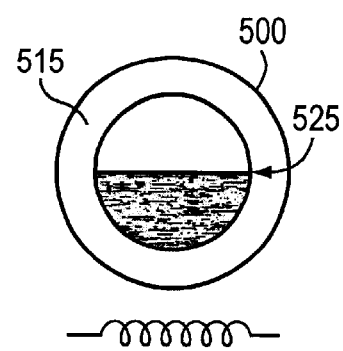
FIG. 5A  FIG. 5B  FIG. 5C
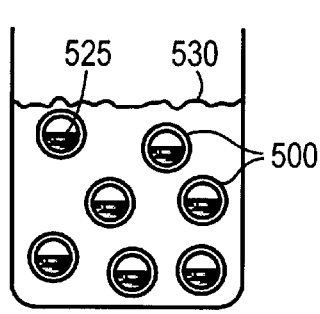
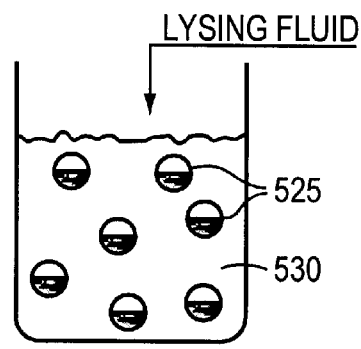
FIG. 5D  FIG. 5E
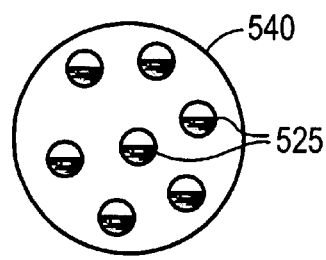
FIG. 5F

HETEROGENEOUS DISPLAY ELEMENTS AND METHODS FOR THEIR FABRICATION

RELATED APPLICATION

This application stems from U.S. Provisional Application Ser. No. 60/085,578, filed May 15, 1998.

FIELD OF THE INVENTION

The present invention relates to microparticles and their production, functional fluids containing microparticles, and microparticle-based display and information-bearing elements.

BACKGROUND OF THE INVENTION

Colors are imparted to various media by dissolving and/or dispersing organic dyes in them, or by suspending insoluble inorganic pigments in the media during their manufacture. Colored media may serve as the material out of which an end product is fabricated (e.g., in the case of plastic articles), or may be applied to a substrate in the form of an ink, paint or toner. Electrophoretic toners, for example, consist of pigments dispersed in an oil-based, low-viscosity carrier. The pigments are given electrical charges so they can be attracted by electrical charges of opposite polarity on a substrate. During an imaging procedure, the pigment particles migrate, driven by electrostatic attraction, towards the substrate surface in response to an imagewise electrical charge pattern applied thereto.

Pigments may also be retained within a permanent liquid carrier to form displays. An electrophoretic display utilizes charged particles of one color suspended in a dielectric liquid medium of a different color. The suspension is housed in a cell located between (or partly defined by) a pair of oppositely disposed electrodes, one of which is optically transmissive. When the electrodes are operated to apply a DC or pulsed field across the medium, the particles migrate toward the electrode of opposite sign. The result is a visually observable color change. In particular, when a sufficient number of the particles reach the optically transmissive electrode, their color dominates the display; if the particles are drawn to the other electrode, however, they are obscured by the color of the liquid medium, which dominates instead.

As a rule, pigments consist of poorly dispersed, agglomerated discrete particles whose approximate coloring effects are derived from the widely varying shape and size distributions throughout the carrier material. Different colors and hues are obtained by mixing quantities of different color pigments. It has been found, however, that the purity and predictability of color relates quite specifically to the particular size, shape, and morphology of the pigment particles. For demanding colorant applications, it is desirable to utilize pigment particles exhibiting a narrow size distribution (i.e., which are monodispersed), identical shape (frequently, but not always spherical), identical bulk properties, and identical surface electrical properties (directly or through additives). Heretofore, such uniform synthetic pigment particles have been difficult to manufacture in a controllable, inexpensive fashion.

At the same time, while pigment particles have been utilized in electrophoretic displays, many common forms of electronic display require larger and/or specialized elements that are expensive to fabricate. It would be beneficial to utilize the versatility of pigments in connection with the many types of display and information-bearing devices that currently require specialized components.

DESCRIPTION OF THE INVENTION

Brief Summary of the Invention

In a first aspect, the present invention comprises methods of fabricating pigment particles of uniform morphology and of a narrow size range. The particles may be spherical or anisotropic (e.g., disk-like), and typically have sizes that can range from several nanometers to 100 $\mu$m. The particles may be provided with a polymer coating to confer desired charge, photoresponse or density characteristics. By matching the density of the particles to that of the surrounding medium, it is possible to fabricate particle-based displays that avoid problems of agglomeration. In addition, by conferring different densities to different classes of particle, it is possible to separate the particles into distinct regions by centrifugation.

A polymer-coated particle may be formed from a conventional inorganic or organic pigment as follows. First, the polymer material is dissolved in a solvent to form a solution, which is combined with a homogeneous suspension of pigment particles. The dissolved polymer is then caused to adsorb onto the surfaces of the pigment particles, and the adsorbed polymer is precipitated to form coatings on the particles. The thickness of a coating may be controlled so as to form only a thin shell (e.g., for purposes of conferring a surface charge) or a thick covering. In the latter case, the volume of the polymer coating may be substantially greater than that of the surrounded core, thereby dominating the density characteristics of the composite particle; in addition, the shape of a thick outer coating can be controlled so as to establish the overall shape and dimension of the final particle. For example, if precipitation occurs under centrifugation, the particles will exhibit a disk-like (rather than spherical) shape.

In a second aspect, the invention provides for manufacture of optically heterogeneous display elements using particles as described above. These particles may be microencapsulated prior to formation of the display element, so that the element is formed internally within the container in which it is permanently housed. In accordance with this aspect of the invention, two types of particles, generally in equal proportions, are encapsulated in microcontainers. The two particles are optically distinct (e.g., of different colors or shades, different refractive indices, different fluorescent properties, and/or different phosphorescent properties) and also respond differentially to an external stimulus (e.g., an electric, magnetic, or gravitational field). The external stimulus is applied to the microcontainers, thereby separating the particles into distinct regions within the microcontainers, and the particles, thus separated, are fused into a single encapsulated element. Fusing may be accomplished by exposure to energy in the form of, for example, heat, actinic radiation, ultrasound or radio-frequency (RF) radiation. If the differential response persists within the fused element, it can be used to orient the element within the microcontainer.

In a variation to this approach, optical contrast is provided not by complementary halves of the display element, but instead by a carrier medium that contrasts with a unitary display element. The element may be a hemisphere contained within a spherical microcapsule and surrounded by a carrier medium (typically, although not necessarily, liquid), the element and the carrier contrasting in terms of at least one optical property of interest. For example, the hemisphere and the carrier medium may be differently colored, so that if the hemisphere is adjacent the portion of the microcapsule that is viewed, its color dominates the display; if the element is drawn to the other side of the display, however, it is obscured by the color of the carrier medium, which dominates instead.

More generally, the display element is formed by encapsulating a suspension of particles within an optically transmissive container having an interior surface contour. The particles are responsive to an external stimulus and are suspended within a carrier medium that contrasts visually with the particles. The external stimulus is applied to the encapsulated particles to aggregate the particles, which are joined into a single encapsulated element having a surface conforming to the interior surface contour of part of the container. In this way, the element is visible through a portion of the container and obscured by the carrier medium through another portion of the container, so that what the viewer observes depends on the relative position of the element.

In a third aspect, the invention provides for manufacture of light-valve elements based on fused particles. A suspension of particles opaque to light is encapsulated within an optically transmissive container. The particles are caused to form a disk, following which they are joined together into a single encapsulated element.

With this element oriented with its edge toward the viewer, visible light can pass through the capsule to be observed by the viewer; but with the element oriented with its face toward the viewer, visible light emanating from behind the capsule will be blocked. The disk may be formed as a single element within the capsule, or sandwiched between transparent hemispheres. Generally, the container is substantially spherical, and the disk defines a great circle through the spherical container while the transparent particles form substantially equal hemispherical volumes on each side of the disk. In alternative versions of this embodiment, light blockage is provided by acicular particles rather than disk-shaped particles.

In a fourth aspect, the invention provides for manufacture of optically heterogenous display elements by means of chemical complementarity. In particular, first and second particles having different optical properties (e.g., contrasting colors) and complementary surface-exposed chemical groups are allowed to interact. If the exposed chemical groups are confined to a small area of the particle surfaces, each particle will attract no more than a single other particle. If necessary, the particles are then fused together into a single display element.

In a fifth aspect, the invention provides for manufacture of magnetically responsive elements. A suspension of magnetic particles is encapsulated, the particles caused to aggregate, and the aggregated particles joined into a single encapsulated element. The element is then subjected to a magnetic field to induce a magnetic dipole therein. Because it remains free to rotate within its capsular enclosure, the element may exhibit a high remanent magnetization yet low coercivity. The encapsulated elements may be arranged on a substrate and their magnetic orientations set to encode information, which can be read remotely by a harmonic tag reader.

BRIEF DESCRIPTION OF THE DRAWINGS

The foregoing discussion will be understood more readily from the following detailed description of the invention, when taken in conjunction with the accompanying drawings, in which:

FIGS. 5A–5F illustrate manufacture of electronic display media based on heterogeneous mixtures of particles;

Figure 1A:
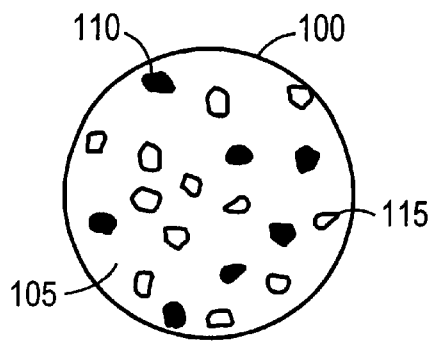
FIGS. 1A–1E depict fabrication and operation of an optically heterogeneous display element in accordance with the invention.

DETAILED DESCRIPTION OF THE PREFERRED EMBODIMENTS a. Microparticle Synthesis

Particles suitable for use with a variety of structures in accordance with the invention may be fabricated by dissolving a polymer material in a solvent to form a solution, combining the solution with a homogeneous suspension of pigment particles, causing the dissolved polymer to adsorb onto the surfaces of the pigment particles, and finally precipitating the adsorbed polymer to form coatings on the particles. The solvent may be a so-called "theta" solvent that dissolves a polymeric material at a temperature greater than the theta temperature, which depends both on the composition of the polymeric material and its molecular weight. The theta temperature is typically well above room temperature, a characteristic that contributes to manufacturing convenience in the present context, since surface precipitation can be achieved by allowing the solution to cool. Theta solvents can be non-volatile (e.g., Isopar and formic acid) or volatile (e.g., toluene, dodecane, and ethanol). Polymers useful in conjunction with such solvents include polyethylenes and polyamides such as nylon.

EXAMPLE 1

This example describes preparation of polyethylene-coated pigment particles that exhibit a surface charge (since polyethylene is a charge-control agent) and a density usefully close to typical carrier liquids as described below in connection with various encapsulated structures.

A first liquid is prepared by combining polyethylene in liquid form and Isopar. The polyethylene component is present in proportions ranging from 10–50 wt %, with 30 wt % preferred; and the Isopar is present in proportions ranging from 50–90 wt %, with 70 wt % preferred.

A second liquid is prepared by suspending an inorganic pigment in Isopar. The inorganic pigment may be, for example, $TiO_2$ (e.g., TiPure), and is present in loading fraction of 5–20 wt %. The liquids are separately heated to a temperature greater than 75° C., and the second liquid is sonicated with ultrasound for 30 sec to ensure an even dispersion. The two liquids are then mixed and the temperature maintained above 75° C. for twenty minutes, thereby allowing the polymer to be adsorbed onto the surfaces of the particles. After 4 min, the mixture is ice quenched under sonication to precipitate the deposited polyethylene as a surface coating. Beginning with $TiO_2$ particles having diameters of about 300 nm, the above procedure results in deposition thereon of polyethylene coatings having thicknesses of 50–100 nm. A 100-nm shell has a volume 3.6 times greater than the 300-nm particle upon which it is coated.

EXAMPLE 2

This example illustrates the use of a surfactant in the preparation of polymer-coated pigment particles without the need to heat to a theta temperature.

A first liquid is prepared by combining polystyrene in liquid form and dichloromethane. The polystyrene component is present in proportions ranging from 1–10 wt %, with 5 wt % preferred; and the dichloromethane is present in proportions ranging from 90–99 wt %, with 95 wt % preferred.

A second liquid is prepared by suspending an inorganic pigment in a mixture of dichloromethane, Isopar, and a polymeric surfactant such as poly(ethylene-altmaleic anhydride). The inorganic pigment may be, for example, a magnetic pigment (e.g., Ferro V), and is present in loading fraction of 1–5 wt % (preferably 1.5 wt %). The proportion of dichloromethane ranges from 30–50 wt % (preferably 36 wt %); the proportion of surfactant ranges from 0.1–1% (preferably 0.5 wt %); and the remainder is Isopar.

The second liquid is sonicated to disperse the pigment, and the suspension is stirred for 20 min to allow the polymeric surfactant to be adsorbed onto the particle surfaces. The first and second liquids are then combined, and the mixture heated to 40° C. to evaporate the dichloromethane.

EXAMPLE 3

This example illustrates the use of different theta solvents and polymers in the preparation of polymer-coated pigment particles.

A first liquid is prepared by combining a polyamide such as nylon in liquid form with a suitable theta solvent such as ethanol or formic acid. A second liquid is prepared by suspending an inorganic pigment in the theta solvent. The relative proportions of these components are straightforwardly selected without undue experimentation by one skilled in the art.

The liquids are separately heated to a temperature greater than the theta temperature so that the polymer enters solution. The second liquid is sonicated with ultrasound for 30 sec to ensure an even dispersion of pigment. The two liquids are then mixed and the temperature maintained above the theta temperature for twenty minutes, thereby allowing the polymer to be adsorbed onto the surfaces of the particles. After 4 min, the mixture is ice quenched under sonication to precipitate the deposited polyamide as a surface coating.

Any of the procedures described in Examples 1–3 can be modified to include a charge-control agent (CCA) or photoconductive agent by dissolving this material along with the polymer and co-precipitating it. As indicated above, a CCA is added to the pigment particles to confer a surface charge (zeta potential). For applications involving electrophoretic displays, the CCA desirably confers a zeta potential equal to 50–100 elementary charges on the surface of a particle 1 μm in radius; this produces a sufficient electrophoretic mobility on the order of $10^{-4}$ to $10^{-5}$ $cm^2$/V-sec. Suitable CCAs are well known in the art; they may be polymeric or non-polymeric in nature, and may also be ionic or non-ionic. CCAs conferring a negative charge include Kayaset Black T-2 and Spilon Black TRH; CCAs conferring a positive charge include Bontron N-01. Other CCAs include polyethylene, polybutene succinimide and various polyvinyl pyridine block copolymers. See, e.g., U.S. Pat. Nos. 5,380,362, 5,066,559 and 4,298,448, the entire disclosures of which are hereby incorporated by reference. The CCA should not interfere with the optical properties of the pigment particles.

Representative photoconductive agents include squarylium dye, SeTe, $As_2Se_3$, and α-Si.

Any of the procedures described in Examples described in Examples 1–3 can be carried out under centrifugation to produce anisotropic particles.

EXAMPLE 4

This example illustrates preparation of magnetically susceptible particles from a ferrofluid—i.e., a colloid that contains suspended magnetic particles and which responds to an applied magnetic field as if the fluid itself possessed magnetic characteristics.

A first liquid is prepared by combining polyethylene in liquid form and Isopar. A second liquid is prepared by combining the ferrofluid with Isopar. The proportions of Isopar in both liquids are straightforwardly selected without undue experimentation by one skilled in the art.

The liquids are separately heated to a temperature greater than 75° C., and the second liquid is sonicated with ultrasound for 30 sec to ensure an even dispersion. The two liquids are then mixed and the temperature maintained above 75° C. for twenty minutes, thereby allowing the polymer to be adsorbed onto the surfaces of the particles. After 4 min, the mixture is ice quenched under sonication to precipitate the deposited polyethylene as a surface coating.

EXAMPLE 6

A two-color particle may be fabricated by precipitating methylmethacrylate in styrene, following by dyeing, as described in Chen et al., "Interfacial Phenomena Controlling Particle Morphology of Composite Latexes," *J. Appl. Poly. Sci.* 42:1049–1063, the entire disclosure of which is hereby incorporated by reference.

b. Encapsulation

Many of the applications discussed below require encapsulation of a particle dispersion. A preferred technique for encapsulation is as follows.

EXAMPLE 6

A continuous aqueous phase is prepared by combining a polymeric surfactant such as poly(ethylene-alt-maleic anhydride) with urea, resorcinol and water in suitable proportions. The dispersed phase is a suspension of the particles to be encapsulated in a lipid (generally oil) carrier. The pH of the continuous phase is adjusted to 3.5, and the two phases are combined and homogenized; the degree of homogeneity determines the size of the microcapsules. Representative homogenization conditions involve stirring at 10,000 RPM for 6 min. An aldehyde (e.g., formaldehyde) is added, and the mixture heated to 50° C. for 3 hr.

The mechanism of encapsulation is as follows. Homogenization emulsifies the lipid phase of the mixture into minute droplets, which are covered by the surfactant. The polar (e.g., maleic) groups of the surfactant interact with the aqueous medium while the nonpolar (e.g., polyethylene) groups enclose the oil droplets, thereby stabilizing the emulsion. Within the aqueous phase, the urea serves as a monomer, the resorcinol as a cross-linker, and the aldehyde as a polymerization initiator. Heating causes polyurea to form in the bulk aqueous solution as small particles that deposit onto the surfactant-coated surfaces of the oil droplets. Further polymerization links the deposited particles into a shell around the oil droplets, thereby permanently encapsulating them.

The relative proportions of the various components are straightforwardly selected without undue experimentation by one skilled in the art.

c. Optically Heterogeneous Display Elements

With reference to FIG. 1A, an optically transmissive capsule 100 surrounds a particle dispersion that includes a carrier medium 105 having dispersed therein a mixture of first particles 110 and second particles 115. First and second particles 110, 115 differ from each other both optically and in terms of a physical characteristic that provides the basis for their separation. For example, the particles may be differently colored and have different surface charges. Such particles may be obtained in accordance with the above-described procedures by surrounding differently colored pigment core particles with transparent polymer coatings having different zeta potentials.

The capsule 100 is sandwiched between a pair of electrodes 120, 125 and a voltage applied thereacross. Negatively charged (or less positively charged) particles 115 migrate toward electrode 120, which has a positive charge, while positively charged (or less negatively charged) particles 110 migrate toward electrode 125, which carries a negative charge. It should be stressed that particles 110, 115 need not be oppositely charged (i.e., have zeta potentials of opposite sign) to function in the foregoing manner. Even a marginal difference in surface charge is sufficient to induce the proper response. For example, one set of particles might have a positive or negative surface charge conferred by a CCA and the other set of particles have either no charge or a lesser charge of the same sign.

Figure 1B:
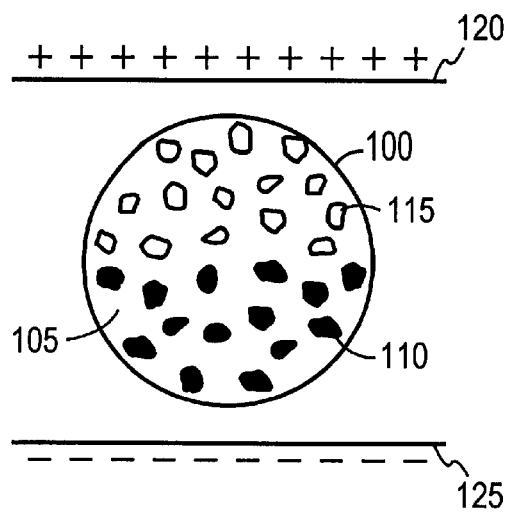

Furthermore, characteristics other than charge can be used to cause the particles to separate into the distinct hemispherical regions illustrated in FIG. 1B. For example, the particles 110, 115 may exhibit different degrees of magnetic susceptibility, responding differently to an applied magnetic field so as to separate; or may have different densities, separating in response to a gravitational field imposed by centrifugation; or may instead be differently colored, separating in response to differential absorption of light of a particular color.

Figure 1C:
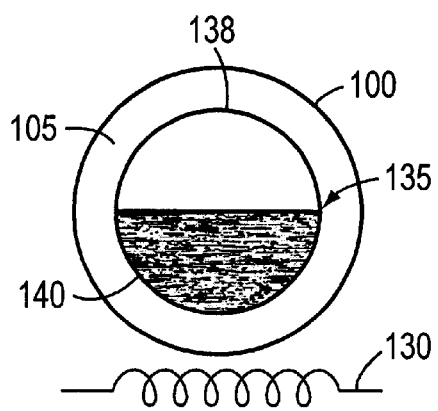

The separated particles 110, 115 are then joined into a single element 135 as shown in FIG. 1C. This operation is especially straightforward if the particles 110, 115 are polymeric or have polymer coatings, which can be melted by application of heat by a source 130, allowed to intermingle with one another, and then resolidified by cooling. Other approaches for fusing particles 110, 115 are also possible, however. For example, the particles may be fabricated from (or surrounded by) a polymer with pendant radiation-curable functional groups, which do not interact during particle separation but bond with one another upon exposure to actinic (typically ultraviolet, or "UV") radiation. Suitable UV-responsive functional groups include acrylates, methacrylates, and vinyls. Indeed, the particles may be surrounded by monomeric constituents that coalesce into a solid shell, as well as bonding to neighboring shells, upon exposure to actinic radiation. Alternatively, the particles may be surrounded by shells of a multifunctional polymer that have been cured into solidity by a mechanism that affects one set of functional groups but not another, the latter remaining available to bond to the shells of neighboring particles when exposed to source 130.

It should also be noted that source 130 can emit forms of energy other than radiation or heat; particles 110, 115 can, for example, be fused by exposure to ultrasound or RF. In still another approach, capsules 100 contain epoxy groups that establish chemical bonds to each other over time (i.e., without exposure to energy).

Figure 1D:
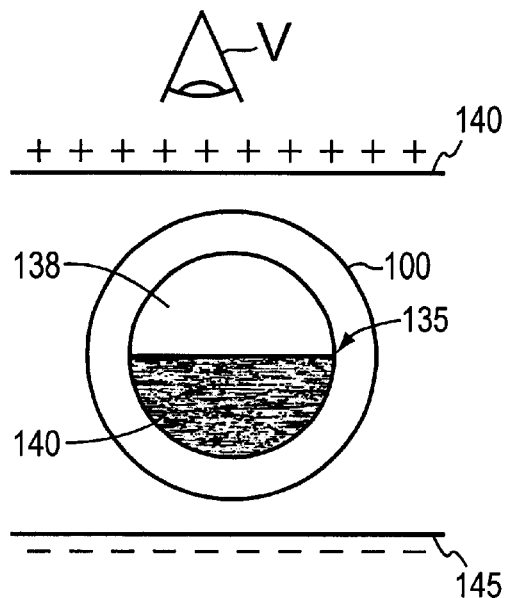
Figure 1E:
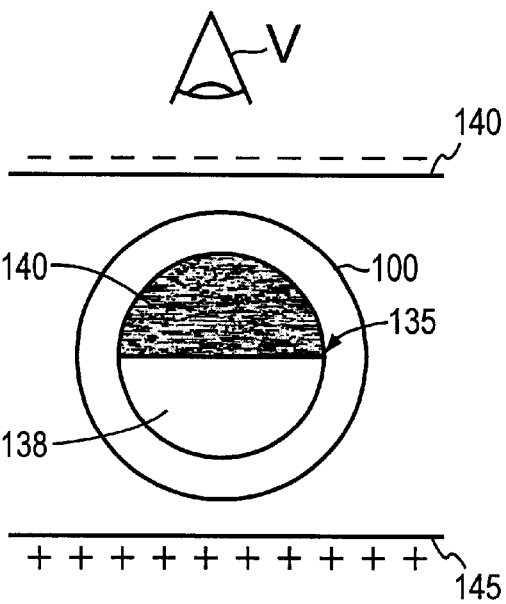

Fusion of particles 110, 115 results in a single, substantially spherical element 135 having two hemispheres 138, 140. Hemisphere 138 exhibits the optical property associated with particles 115, while hemisphere 140 exhibits the optical property associated with particles 110. As noted above, the optical property may be color or shade. So long as the hemispheres 138, 140 retain the physical characteristic that provided the basis for separation of particles 110, 115, the element 135 may be addressably oriented so that one hemisphere or the other is visible to the user. In the case of different surface charges, an electrostatic field may be used to orient the element 135. As shown in FIGS. 1D and 1E, the field may be applied by a pair of electrodes 140, 145. At least electrode 140 is optically transmissive, so that a viewer V sees either hemisphere 138 or 140, depending on the orientation of the field. Alternatively, electrodes 140, 145 can take the form of perpendicularly oriented address lines that intersect across capsule 100.

The optical property (or properties) by which particles 110, 115 differ need not be color or shade. Instead, depending on the application, particles 110, 115 can exhibit different refractive indices, different fluorescent properties, and/or different phosphorescent properties. Capsule 100 is typically a microcapsule 5 to 500 $\mu$m in diameter, and preferably 25 to 250 $\mu$m in diameter, but this is not critical; for example, the invention may be practiced with substantially larger capsules depending on the application. It should be stressed, however, that large capsules limit display resolution.

It is also possible to obtain two separate hemispherical elements 138, 140 that are not joined to each other. This may be accomplished, for example, by utilizing particles fabricated from (or surrounded by) polymers having functional groups chemically compatible with those of similar particles but not with those of the other particles. In this way, each set of particles 110, 115 is cured into a separate hemispherical element 140, 138 that is not joined to the other element.

It should also be noted that carrier medium 105 need not be a fluid. Instead, it may be particulate (e.g., a fine powder) in nature.

Figure 2A:
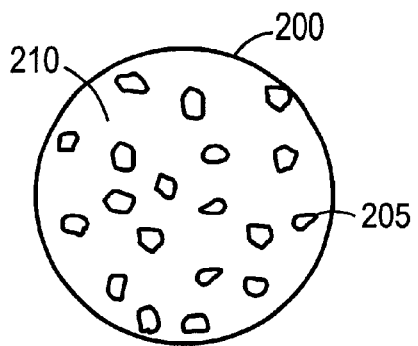
FIGS. 2A–2C depict fabrication of an optically heterogeneous display element where optical contrast is provided by a carrier medium.
Figure 2B:
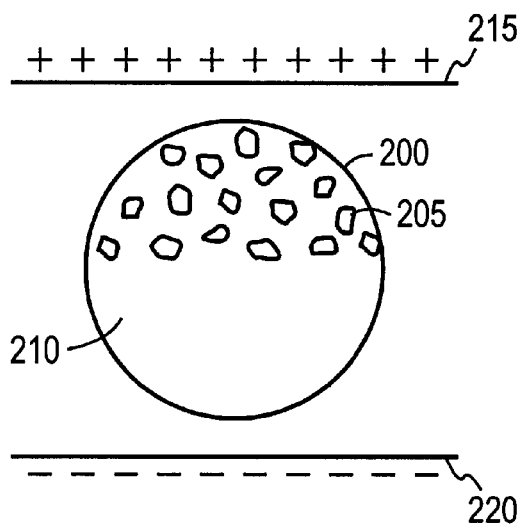
Figure 2C:
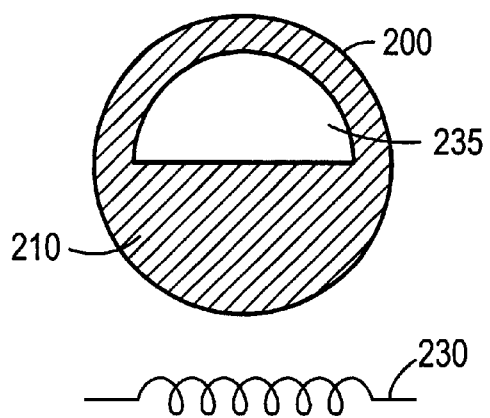

As shown in FIGS. 2A–2C, it is not necessary to utilize a heterogeneous particle (such as a bichromal sphere) in order to obtain selectable optical properties. Instead, an optically transmissive capsule 200 contains a suspension of a single type of particle 205 within a carrier medium 205. The particles 205 are responsive to an external stimulus, which is used to aggregate the particles and, typically, to manipulate the display element as well. If the particles 205 have a surface charge, an electric field produced by two opposed electrodes 215, 220 concentrates the particles 205 toward the oppositely charged electrode 215 as shown in FIG. 2B.

An energy source 230 fuses the aggregated particles into a single hemispherical (or hemispherically surfaced) element 235 (see FIG. 2C). The element preferably remains responsive to the external stimulus that provided the basis for aggregation of particles 205. Accordingly, using this stimulus, the element 235 may be addressably oriented so as to be adjacent the portion of capsule 200 that viewer observes, in which case the viewer sees the element 235; or adjacent the opposite portion of capsule 200, in which case the viewer sees the carrier medium 210, which obscures element 235.

The stimulus used to aggregate the particles 205 need not be the same one used to address element 235. For example, so long as the density of the particles 205 differs from that of carrier medium 210, the particles may be aggregated by centrifugation, while magnetic or electric force is used to position element 235. Once again, the optical property distinguishing element 235 from carrier medium 210 need not be color or shade, but may instead be refractive index, fluorescent properties, and/or phosphorescent properties. Also, the carrier medium 210 may be fluid or particulate in nature.

d. Light Valves

Refer now to FIG. 3, which illustrates one approach toward formation of encapsulated light-valve elements. Contained within a capsule 300 are three types of particles: first and second sets of transparent particles 310, 315, present in approximately equal proportions; and a set of particles 320 opaque to visible light (or some other wavelength band of interest). Particles 310, 315, 320 are suspended in a carrier medium 325.

Figure 3A:
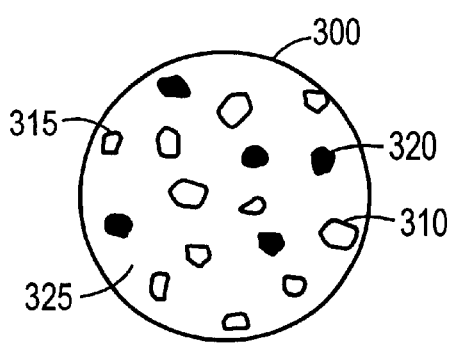
FIGS. 3A–3E illustrate fabrication and use of a light valve element.
Figure 3B:
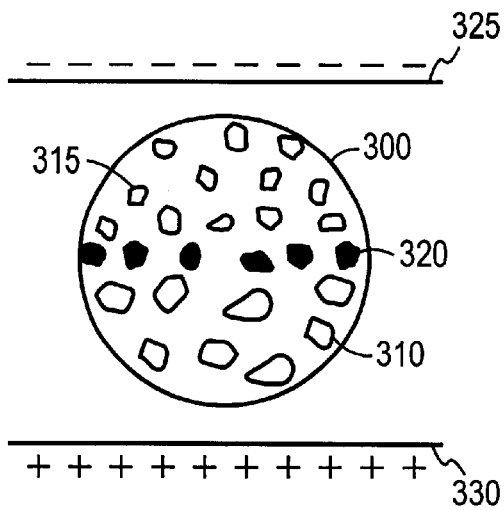
Figure 3C:
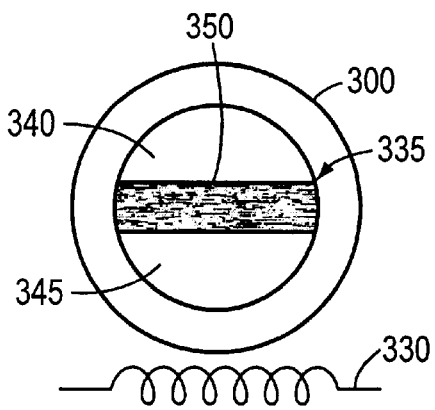
Figure 3D:
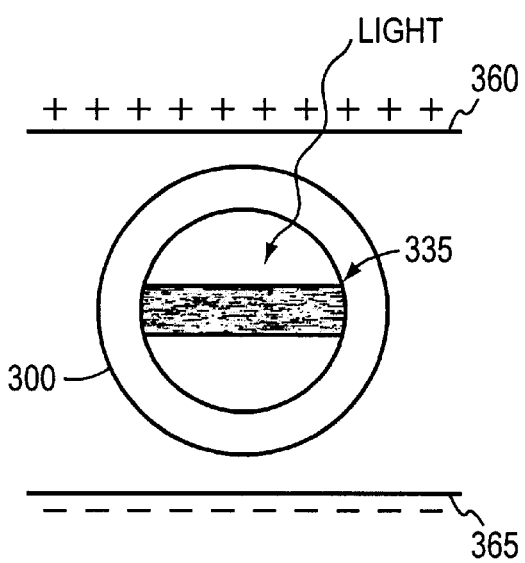

As shown in FIG. 3B, the particles are segregated within capsule 300 so that particles 320 form a disk sandwiched between approximately equal numbers of particles 310 on one side and particles 315 on other the side. This may be accomplished by conferring a different physical characteristic on each type of particle, and exploiting the difference using an external stimulus. For example, particles 310 may carry a negative zeta potential, particles 310 a positive zeta potential, and particles 320 no net surface charge. By placing the capsule 300 between a pair of parallel electrodes 325, 330 and creating an electrostatic field therebetween as shown, the particles 310 will be attracted to electrode 330 while particles 315 migrate toward electrode 325, leaving particles 320 to aggregate in a central region.

More generally, a similar effect can be achieved merely by different, rather than opposed, exploitable physical characteristics. For example, the particles 310, 315, 325 may simply have different (rather than differently signed) zeta potentials; so long as particles 315 are more positive (or less negative) than particles 320, which are themselves more positive (or less negative) than particles 310, creation of the illustrated potential difference across electrodes 325, 330 will cause the particles to segregate substantially as shown. A similar effect can be obtained by using particles of different densities and subjecting the capsule 300 to centrifugation.

The requisite particle proportions can be maintained within numerous capsules simultaneously formed in a bulk particle suspension by maintaining a high degree of colloidal homogeneity prior to and during encapsulation. In this way, the particle population of each capsule will reflect the distribution within the carrier fluid.

An energy source 330 fuses the aggregated particles into a single spherical element 335 comprising first and second opposed, transparent hemispheres 340, 345 sandwiching an opaque disk 350 (see FIG. 2C). If the different regions of element 335 retain different surface-charge characteristics, application of a DC field between a pair of electrodes 360, 365 will cause the element 335 to orient such that the disk 350 faces the electrodes. (The direction of the DC field is irrelevant, since hemispheres 345, 350, while electrically different, are optically identical, so it does not matter which hemisphere faces a particular electrode.) If both electrodes are transparent, light emanating from behind one of the electrodes will be blocked by element 335, and will not be visible through the opposite electrode. Alternatively, electrodes 360, 365 can take the form of perpendicularly oriented address lines that intersect across capsule 300.

When electrodes 360, 365 are connected to an AC source 370, the asymmetric internal charge distribution causes element 335 to orient with the edge of disk 350 toward the electrodes. Accordingly, the orientation of element 335 can be changed by switching from a DC to an AC field across electrodes 360, 365.

Figure 3E:
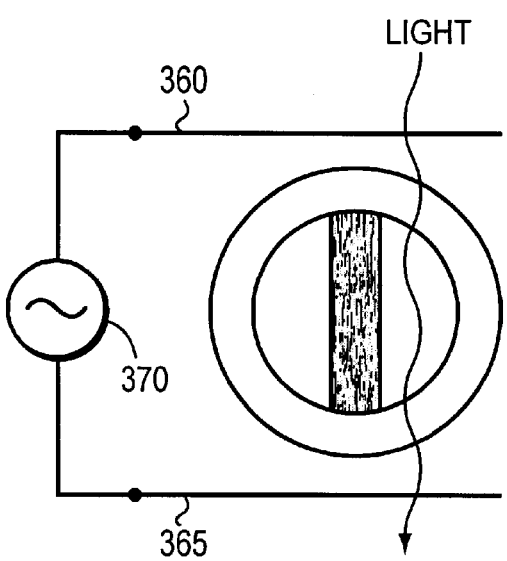

Alternatively, it is possible to utilize materials having different frequency-dependent dielectric constants as described in U.S. Pat. No. 4,261,653, the disclosure of which is hereby incorporated by reference. In this case, the materials of hemispheres 340, 345 have a first frequency-dependent dielectric constant and the material of disk 350 have a second frequency-dependent dielectric constant. With AC source 370 operated at one frequency, the electrical permittivity of hemispheres 340, 345 is greater than that of disk 350 and, as a result, the differential induced charge in disk 350 causes the disk to face electrodes 360, 365; with AC source operated at another frequency, the electrical permittivity of hemispheres 340, 345 is less than that of disk 350, and disk 350 re-orients with its edge toward electrodes 360, 365 as shown in FIG. 3E.

Figure 4A:
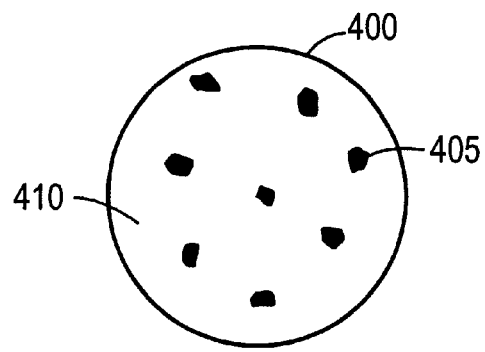
FIGS. 4A–4C illustrate fabrication and use of another light valve element.
Figure 4B:
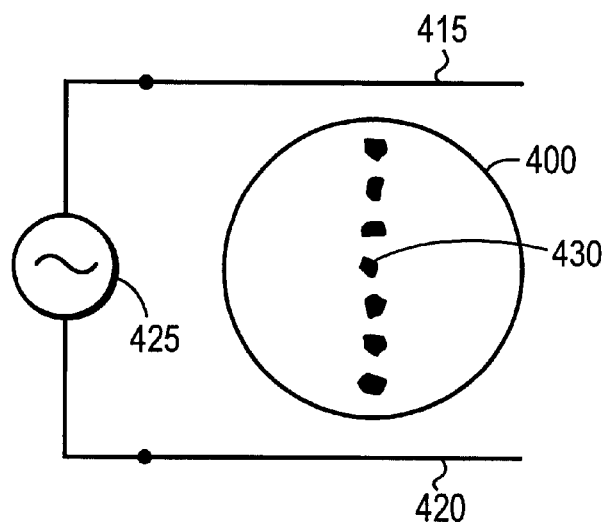

FIG. 4 illustrates an alternative approach toward forming a light valve. A capsule 400 contains a dispersion of particles 405 in a carrier medium 410. Particles 405 are opaque to visible light, while carrier medium 410 is transmissive. Particles 405 are also subject to electrorheological or magnetorheological effects. As shown in FIG. 4B, particles 405 and carrier medium 410 may form an electrorheological fluid, i.e., a colloidal suspension of particles that become polarized in the presence of an electric field. This polarization causes the particles to align in rods in response to an AC field, with oppositely charged poles proximate one another. A sufficient number of particles 405 results in formation of multiple rods that align to form a sheet (or, due to confinement by capsule 400, a disk).

Figure 4C:
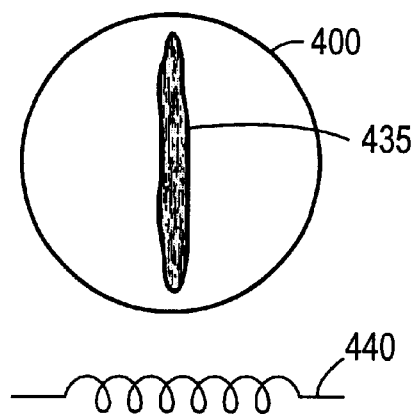
Figure 6A:
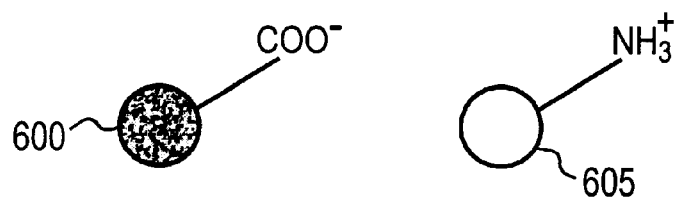
FIGS. 6A–6D illustrate formation of heterogeneous display elements by means of chemical complementarity.
Figure 6B:
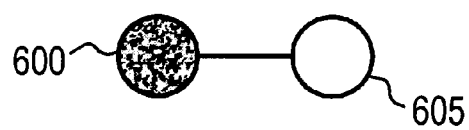
Figure 6C:
Figure 6C:
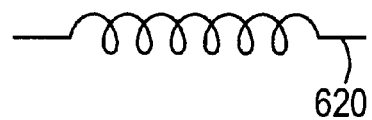
Figure 6D:
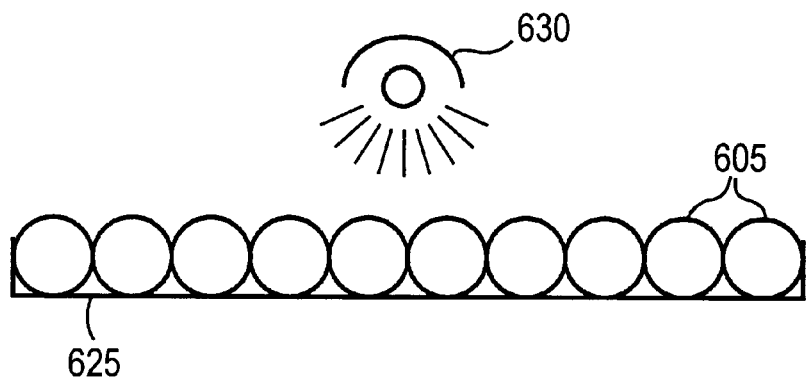

Accordingly, capsule 400 is placed between a pair of electrodes 415, 420 connected to an AC source 425 (see FIG. 4B). The AC signal causes the particles 405 to align into a disk formation 430, which is fused into a solid disk 435 by an energy source 440 (see FIG. 4C). When capsule 400 is subject to an AC field, disk 430 aligns as shown in FIG. 4C, so that light emanating from behind one of the electrodes will be visible through the opposite electrode. In the absence of the field, brownian motion causes the disk 430 to assume a random orientation. Accordingly, if numerous capsules 400 are present in layers within a substrate, the random orientations of disks 435 will block light from passing through the substrate. When an AC field is applied across the substrate, however, light will pass through it.

Similarly, instead of a disk-like shape 430, it is possible to utilize particles that form separate acicular (needle-shaped) structures, which are fused as discussed above. With numerous capsules dispersed in layers within a substrate, application of an AC field will cause the acicular structures to align parallel to the field, allowing light to pass through the substrate. In the absence of the field, random orientations once again block the light.

As noted previously, there is no size restriction governing the capsules in which display elements are contained. Nonetheless, it may prove useful in some applications to utilize multiple small elements—rather than a single large element—within a large capsule. For example, as set forth above, behavior as a light valve may depend on the cumulative action of numerous display elements. FIG. 5 illustrates an approach to constructing a single display capsule containing multiple display elements, which, for purposes of illustration, are bichromal spheres as discussed in connection with FIG. 1. As shown in FIG. 5A, a capsule 500 contains a dispersion of first and second differently colored particles 505, 510 in a carrier medium 515. An electrostatic field is used to separate the particles 505, 510 (FIG. 5B), and the separated particles are fused into a single bichromal element 525 (FIG. 5C). As shown in FIG. 5D, large numbers of capsules 500 containing bichromal elements 525 are dispersed in a carrier fluid 530. To this suspension is added a second fluid that lyses (and preferably dissolves) capsules 500, leaving the unencapsulated bichromal elements 525 in suspension (FIG. 5E). This fluid may be, for example, methyl ethyl ketone. Alternatively, capsules 500 may be lysed by application of pressure.

As shown in FIG. 5F, the suspended elements 525 are resuspended in a carrier medium and re-encapsulated using the procedures described above (e.g., in Example 5). The size of the resulting capsules is determined primarily by the shear rate during the encapsulation procedure, while the number of display elements 525 per capsule depends on their concentration within the carrier medium. It should be understood that the foregoing procedure can be applied to spherical, disk-like or acicular particles as previously described.

e. Self-Assembling Heterogeneous Display Elements

Another approach toward formation of a heterogeneous particle is illustrated in FIG. 6. A first type of particle 600 has a first pendant chemical group (e.g., carboxyl) exposed on a portion of its outer surface. A second type of particle 605 has a second pendant chemical group (e.g., amine), which is complementary to the first chemical group, exposed on a portion of its outer surface. The particles are allowed to interact as shown in FIG. 6B, the first and second chemical groups establishing ionic, covalent, or hydrogen bonds therebetween so as to associate particles 600, 605 with one another. If necessary, the particles 600, 605 are joined into a single structure 610 by exposure to energy from a source 620. For example, energy source 620 may fuse the particles together by partially melting them, the particles integrating into the single structure 610 upon resolidification. Alternatively, source 620 may emit actinic radiation that creates additional chemical bonds between particles 600, 605 (e.g., if the particle surfaces contain complementary, radiation-activated functional groups).

Naturally, to utilize this approach for bulk manufacture, particles 600, 605 should have pendant chemical functionality exposed on a relatively small region of their outer surfaces, ideally so small as to permit interaction with only a single free particle; otherwise, the particles will tend to agglomerate in clusters rather than pairs. The approach illustrated in FIG. 6D can be used to accomplish this. The particles (e.g., particles 605, as illustrated) are initially be provided with a surface coating that prevents chemical reaction with a donor compound containing the first or second chemical group. The protected particles are placed on a dish 625 and exposed to actinic radiation from a source 630, the radiation reaching only the surface regions facing source 630. The actinic radiation inactivates the surface coating, rendering the particles subject to reaction with the donor compound at the exposed regions. The thus-prepared particles are allowed to react with the donor compound, thereby forming particles having pendant groups on a sufficiently small portion of their surfaces to unite with a single complementary particle.

f. Magnetic Displays and Information-Bearing Structures

Figure 7A:
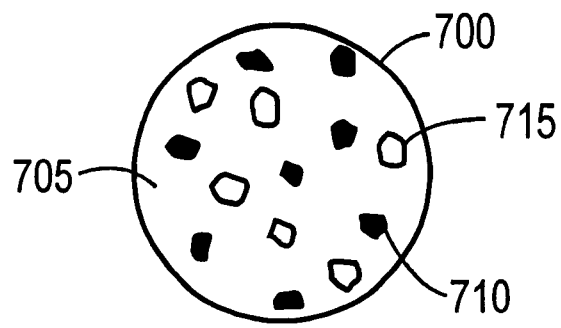
FIGS. 7A–7C illustrate formation of a magnetically responsive display element.

Refer to FIG. 7, which illustrates fabrication of a magnetic display similar in concept to that described in connection with FIG. 1. An optically transmissive capsule 700 surrounds a particle dispersion that includes a carrier medium 705 having dispersed therein a mixture of first particles 710 and second particles 715. First and second particles 710, 715 differ from each other both optically (as described above) and magnetically; in particular, particles 710 are magnetically susceptible and, preferably, ferromagnetic. Such particles may be obtained in accordance with, e.g., Example 4 above. Particles 715 are not magnetically susceptible.

Figure 7B:
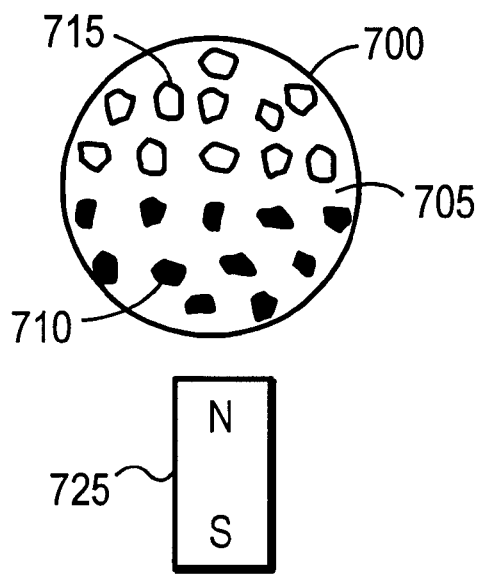
Figure 7C:
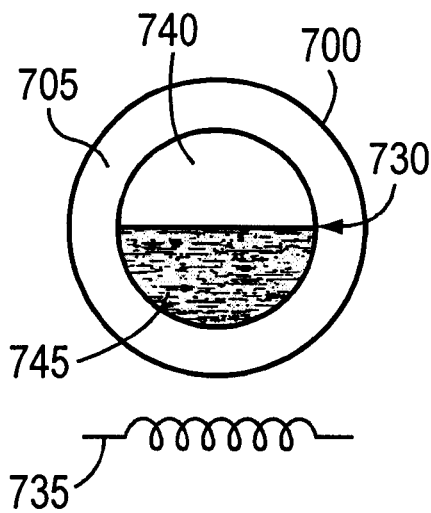

A magnet 725 placed in proximity to capsule 700 attracts particles 710, thereby causing the particles to segregate as shown in FIG. 7B. If the particles 710 are ferromagnetic, exposure to magnet 725 also induces therein a permanent magnetic dipole. The segregated particles 710, 715 are then joined into a single element 730 as shown in FIG. 7C. Once again, this operation is especially straightforward if the particles 710, 715 are polymeric or have polymer coatings, which can be melted by application of heat by a source 735, allowed to intermingle with one another, and then resolidified by cooling. Alternatively, the particles can be joined using any of the other approaches previously described.

Fusion of particles 710, 715 results in a single, substantially spherical element 730 having two hemispheres 740, 745. Hemisphere 745 preferably retains the magnetization induced by magnet 725. With magnet 725 oriented as shown in FIG. 7B, the south pole of the resulting hemisphere 745 will be oriented toward the exterior surface of the hemisphere and the north pole toward the interior of element 730. Accordingly, to orient the element 730 so that a viewer V sees either hemisphere 740, a magnet with the same orientation as magnet 725 is disposed below the capsule 700; the magnet attracts hemisphere 745, thereby presenting hemisphere 740 to viewer V. The orientation of the element 730 is inverted by reversing the polarity of the magnet, which then repels the exterior surface of hemisphere 745 and attracts the interior of element 730.

The structure shown in FIG. 7C can also be used to transfer heat. This application is best understood in the context of magnetization and magnetic properties generally. As is well known, a magnetically susceptible material has small regions, called domains, within which atomic magnetic moments are aligned. In an unmagnetized material, these domains exhibit random orientations. But if an unmagnetized ferromagnetic material is subjected to a magnetic field, the domains tend to align, and those already aligned with the field tend to increase in size. The degree of magnetization is measured in terms of the reverse field strength required to demagnetize the material following this initial exposure. A "hard" or "permanent" magnet is demagnetized only by a large field, whereas a "soft" magnet can be demagnetized by a small external magnetic field. A material can also be demagnetized by heating, which randomizes the magnetic moments of the domains. The temperature at which a material loses its magnetization is called the "Curie temperature."

Accordingly, an element 730 capable of transferring heat has a hemisphere 745 with a relatively low Curie temperature. Furthermore, hemispheres 740, 745 respond differentially to an applied electric field, which is actually used as the motive force to turn the element 730. For example, particles 710, 715 may have different surface charges, and this difference, retained within the bulk hemispheres 740, 745, suffices to render the element 730 responsive to an applied DC field.

The element 730 is disposed between two electrodes as shown in FIGS. 1D and 1E, the direction of the DC field determining the orientation of element 730. One electrode represents or is in contact with a hot environment; a magnet is associated with the opposed electrode. With element 730 oriented so that hemisphere 745 faces the hot electrode, the temperature of hemisphere 745 rises above the Curie temperature and magnetization is lost. When element 730 is flipped so that hemisphere 745 faces the magnet, the magnetic domains align and the material of hemisphere 745 forced to cool; that is, the heat stored in hemisphere 745 is extracted by the magnetic field to which it is subjected. Repeated cycles of this process transfer heat from the hot electrode to the opposite electrode.

Figure 8A:
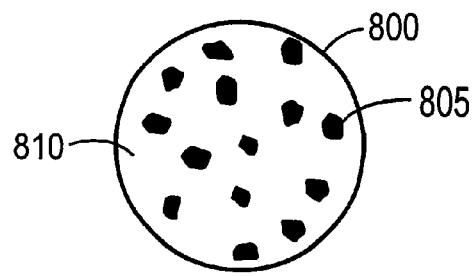
FIGS. 8A–8C illustrate formation of a homogeneous magnetically responsive element.
Figure 8B:
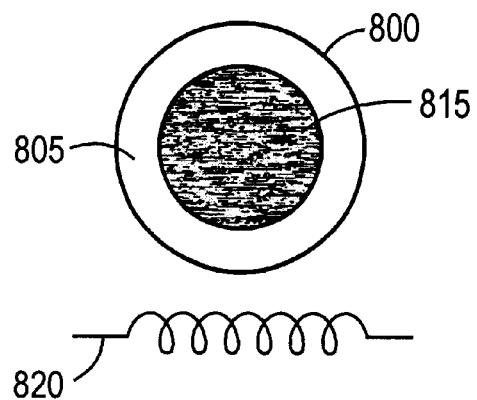

FIG. 8 illustrates formation of a magnetically responsive element that can be used to retain information as described in greater detail below. As shown in FIG. 8A, a capsule 800 surrounds a dispersion of particles 805 in a carrier medium 810. Particles 810 are ferromagnetic, and are coalesced into a more or less unitary mass 815 within capsule 800 (FIG. 8B) by means of an external magnetic field. The coalesced particles are fused together using an energy source 820 in the manner discussed previously.

Figure 8C:
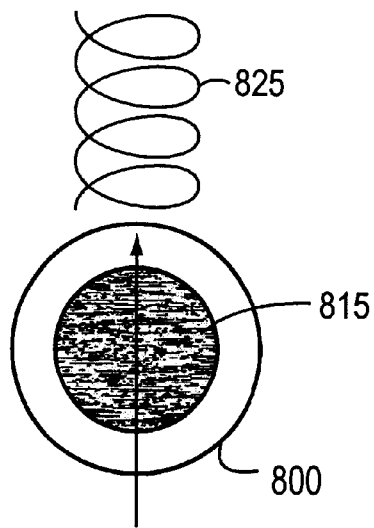

As shown in FIG. 8C, the field produced by an electromagnet 825 is used to magnetize the element 815. Alternatively, depending on the application, it may be useful to simply leave the particles 805 in their original (uncoalesced) form so that each particle is separately magnetized by electromagnet 825. Of course, each particle 805 carries its own magnetic dipole, and brownian motion will eventually cancel the net magnetic moment of the capsule 800.

Figure 9A:
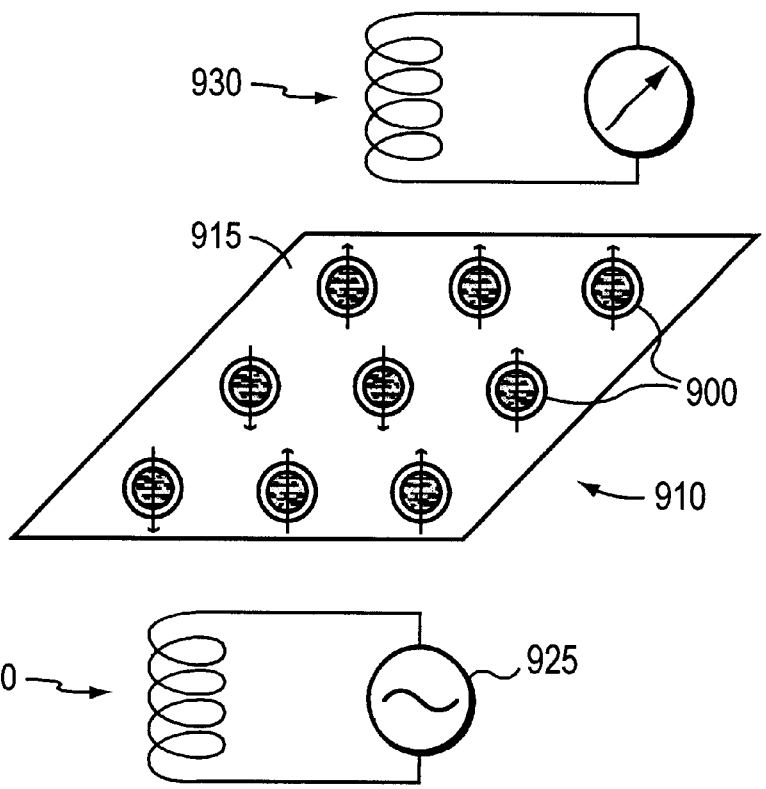
FIG. 9A illustrates a harmonic tag formed from elements formed as shown in FIGS. 8A–8C.

FIG. 9A illustrates the manner in which a series of magnetic elements 900, each of which is a capsule containing an element magnetized as shown in FIG. 8C, can be used in an information-bearing structure 910. That structure may be a film 915 having disposed thereon an ordered array of elements 900, each of which has an associated magnetic dipole; the pattern of dipoles encodes information. This pattern is read by a pair of magnetic coils, namely, a "send" coil 920 that is driven by an AC source 925, and a "receive" coil that measures the magnetic field it experiences.

Figure 9B:
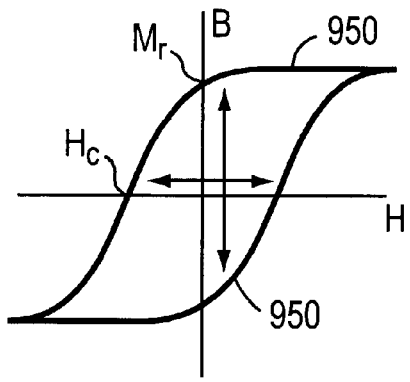
FIG. 9B graphically depicts the B-H curve of a representative ferromagnetic material.

Once again, operation of this device is best understood in the context of general magnetic behavior. As shown in FIG. 9B, the performance of magnetic material can be described by a B-H graph showing the material's magnetic response to a changing applied field. In a demagnetized material, increasing the applied field H increases the magnetic induction B of the material along the magnetization line 950. Thus, the induction increases quickly as the field H rises above zero. When the external field is decreased, however, the magnetic induction retreats relatively slowly along the demagnetization line 955. This hysteresis reflects the tendency of a ferromagnetic material to retain an induced magnetization. Thus, when the applied field strength is reduced to zero, the material still retains a "remanent magnetization" $M_r$. A reverse magnetic field must be applied to return B to zero in a ferromagnetic material; the strength of that field, $H_c$, is termed the "intrinsic coercivity" of the material. The hysteresis loop, then, is characterized by a height bounded by $M_r$ along the B axis and a width bounded by $H_c$ along the H axis.

Naturally occurring magnetic materials are limited in the extent to which they may simultaneously possess large values for $M_r$ and small values for $H_c$; that is, if the material retains a large magnetization when the applied field is removed, it is likely to require substantial reverse field strength to return its magnetization to zero. Elements 900, by contrast, can simultaneously possess high $M_r$ and low $H_c$ due to their physical configuration. That is, the value of $M_r$ is an inherent property of the magnetic particles 805, and can be quite large if, for example, rare earth (e.g., lanthanide) magnetic materials are used. Because element 815 is free to rotate within its capsular enclosure 800, however, the effective coercivity is low, since the applied field need not alter the induced magnetization within element 815; instead, it need only rotate the element. When magnetized, element 815 effectively functions as a single artificial domain.

Figure 9C:
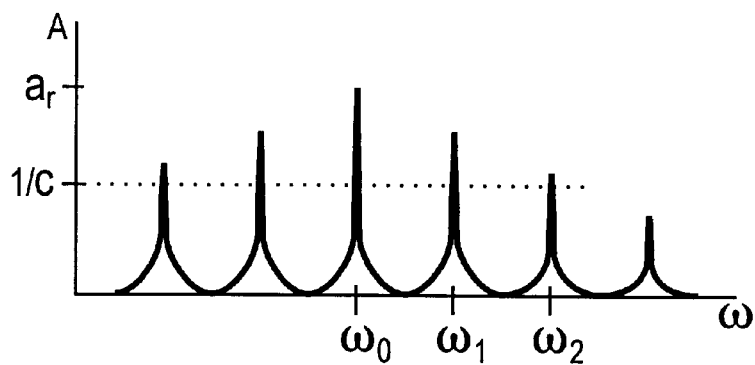
FIG. 9C graphically depicts the magnitudes of magnetic fields sensed in response to a range of driving frequencies, the pattern of which can be used to deduce the dipole pattern of the harmonic tag shown in FIG. 9A.

With renewed reference to FIG. 9A, the information-bearing structure 910 is driven by send coil 920, which produces a uniform magnetic field at a frequency $\omega_0$. A receive coil 930 senses magnetic fluctuations over a range of frequencies or at a plurality of specific harmonic frequencies $\omega_1$, $\omega_2$, etc. as shown in FIG. 9C. The pattern of polar orientations of elements 900 is revealed in the amplitudes of the harmonics. Of course, these harmonics must have sufficiently large amplitudes to be detected and measured accurately by read coil 930.

In general, the number of harmonics with amplitudes larger than 1/e times the peak amplitude $a_r$ (occurring at $\omega_0$) depends on the value of $H_c$ and the rectangularity of the B-H curve, while the value of $a_r$ is a function of the remanent magnetization $M_r$. Accordingly, the structure 910 desirably has a large number of harmonics and a high peak amplitude, since such characteristics maximize the read range of the device—i.e., the amount of information readable by receive coil 930 at long distances from the structure 910. Precisely this combination of characteristics is provided by elements 900 having large values of $M_r$ and small values of $H_c$.

The individual elements 900 within structure 910 may be programmed—that is, their magnetic orientations set—by a magnetic writing head (i.e., a magnet whose field direction and strength are controllable, and which is configured to scan over the array of elements 900); the writing head may address single or multiple elements 900 simultaneously. Additionally, a thermal writing head may be used to demagnetize selected elements 900 by heating them above the Curie point.

One limitation of the structure 910 is that interaction of the elements 900 with the remote field applied by coil 920 alters the domain pattern of the elements, such alteration representing an intrinsic result of the read process. Accordingly, the structure 910 must be reprogrammed after each read.

Figure 10:
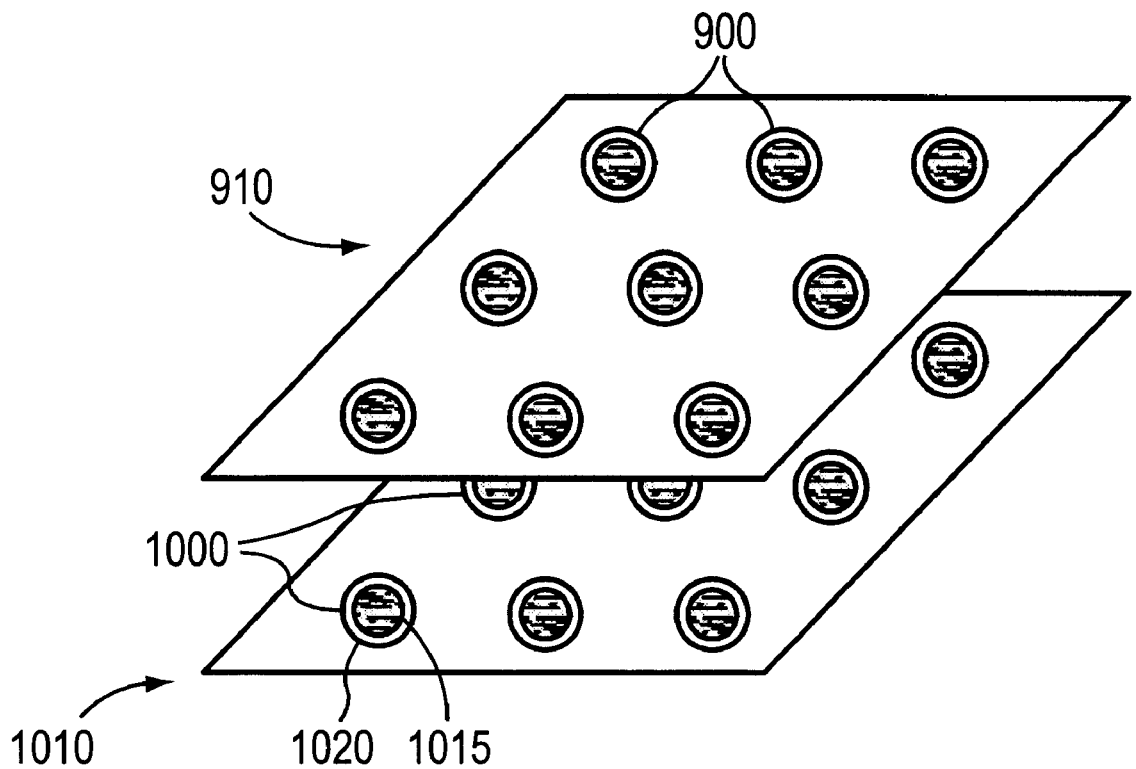
FIG. 10 illustrates a programmable tag comprising magnetic elements formed as shown in FIGS. 8A–8C.

The alternative programmable structure illustrated in FIG. 10 retains its programming notwithstanding interaction with the read field. The array structure 910 discussed above is laminated to an array of programmable magnetic elements 1000 forming a structure 1010. The elements 1000 are similar in construction to the elements discussed above in connection with FIG. 8, each element 1000 comprising an encapsulated magnetic particle 1015. The surrounding carrier medium 1020, however, is a viscous or non-Newtonian fluid (i.e., a fluid in which the viscosity is not independent of the rate of shear or the velocity gradient). Carrier medium 1020 restricts the movement of the particles 1015, which retain a given orientation absent a strong "write" field; in other words, elements 1000 exhibit a relatively high coercivity $H_c$.

Accordingly, programming elements 1000 requires application of the strong write field, which establishes an element's orientation; that orientation is durable and does not change in response to the remote read field. The write field also programs elements 900, which do interact with the remote read field when it is applied. After the read operation, however, the low effective coercivities of elements 900 ensure that they will reacquire the orientations dictated by underlying elements 1000, and so may be read again. The two layers 910, 1010 cooperate to produce a structure that may be permanently (though repeatedly) programmed, yet which can also be read using an external applied field.

It will therefore be seen that the foregoing approaches to microparticle synthesis and use can be applied to a wide variety of display and information-encoding applications, providing economical means for manufacturing structures otherwise obtainable only through expensive, application-specific procedures. The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A method of forming an optically heterogeneous display element, the method comprising the steps of:
   a. encapsulating a suspension of particles, the suspension comprising a mixture of first particles each having a first physical characteristic and second particles each having a second physical characteristic, the first and second particles having different optical properties, the first and second physical characteristics conferring a differential response to an external stimulus;
   b. applying the external stimulus to the encapsulated particles to separate the first and second particles; and
   c. fusing the separated first particles to form a first discrete element and joining the separated second particles to form a second discrete element.

2. The method of claim 1 wherein the first and second discrete elements comprise two substantially hemispherical regions differentially responsive to the external stimulus.

3. The method of claim 1 wherein the first and second discrete elements comprise two substantially hemispherical regions differentially responsive to different external stimuli.

4. The method of claim 1 wherein the fusing step comprises fusing the particles by exposure to energy in the form of at least one of (a) heat, (b) actinic radiation, (c) ultrasound, and (d) RF radiation.

5. The method of claim 1 wherein the first and second particles contrast visually, the element being encapsulated in an optically transmissive container.

6. The method of claim 1 wherein the differential response persists within the single element such that the element may oriented within the capsule by exposure to the external stimulus.

7. The method of claim 6 wherein the external stimulus is an applied electric field, the first and second physical characteristics being different zeta potentials.

8. The method of claim 6 wherein the external stimulus is an applied magnetic field, the first and second physical characteristics being different magnetizations.

9. The method of claim 1 wherein the first and second discrete elements are encapsulated and further comprising the steps of:
   a. forming a plurality of display elements in accordance with steps (a) through (c);
   b. disencapsulating the elements; and
   c. encapsulating multiple ones of the disencapsulated elements in optically transmissive containers as multiple-element displays.

10. The method of claim 1 wherein the first and second discrete elements are hemispherical the elements being unattached to each other.

11. The method of claim 1 wherein the first and second discrete elements are joined into a single spherical element.

* * * * *